United States Patent
Nakajima (10) Patent No.: US 6,246,073 B1
(45) Date of Patent: Jun. 12, 2001

(54) SEMICONDUCTOR DEVICE AND METHOD FOR PRODUCING THE SAME

(75) Inventor: Akio Nakajima, Nara-ken (JP)

(73) Assignee: Sharp Kabushiki Kaisha, Osaka (JP)

(*) Notice: Subject to any disclaimer, the term of this patent is extended or adjusted under 35 U.S.C. 154(b) by 0 days.

(21) Appl. No.: 09/329,236

(22) Filed: Jun. 10, 1999

(30) Foreign Application Priority Data

Jun. 19, 1998 (JP) .................................... 10-173697

(51) Int. Cl.$^7$ ..................................... H01L 23/58
(52) U.S. Cl. ........................... 257/48; 257/106; 257/603; 257/758
(58) Field of Search ............................. 257/48, 330, 106, 257/603, 758; 438/14–18; 324/767

(56) References Cited

U.S. PATENT DOCUMENTS

| | | | |
|---|---|---|---|
| 5,841,164 | * 11/1998 | Tsujino et al. | 257/316 |
| 6,087,707 | * 7/2000 | Lee et al. | 257/530 |

FOREIGN PATENT DOCUMENTS

| | | |
|---|---|---|
| 61-259534 | 11/1986 | (JP) . |
| 62-177960 | 8/1987 | (JP) . |
| 63-93142 | 4/1988 | (JP) . |
| 2-112233 | 4/1990 | (JP) . |

* cited by examiner

Primary Examiner—Sara Crane
(74) Attorney, Agent, or Firm—Nixon & Vanderhye P.C.

(57) ABSTRACT

The present invention provides a semiconductor device having multilayer interconnections including a first interconnection and a second interconnection, wherein: the second interconnection is formed to be connected to one of a ground, a positive power source and a negative power source; the second interconnection is formed either not to be electrically connected to the first interconnection or to be connected to the first interconnection in a high impedance state; and the first interconnection and the second interconnection are electrically connected to each other during or after a characteristic inspection during which the second interconnection is provided with a pad for inspecting characteristics of the semiconductor device.

11 Claims, 9 Drawing Sheets

SEMICONDUCTOR DEVICE AND METHOD FOR PRODUCING THE SAME

BACKGROUND OF THE INVENTION

1. Field of the Invention

The present invention relates to a semiconductor device having multilayer interconnections, and to a production method therefor.

2. Description of the Related Art

Figure 7:
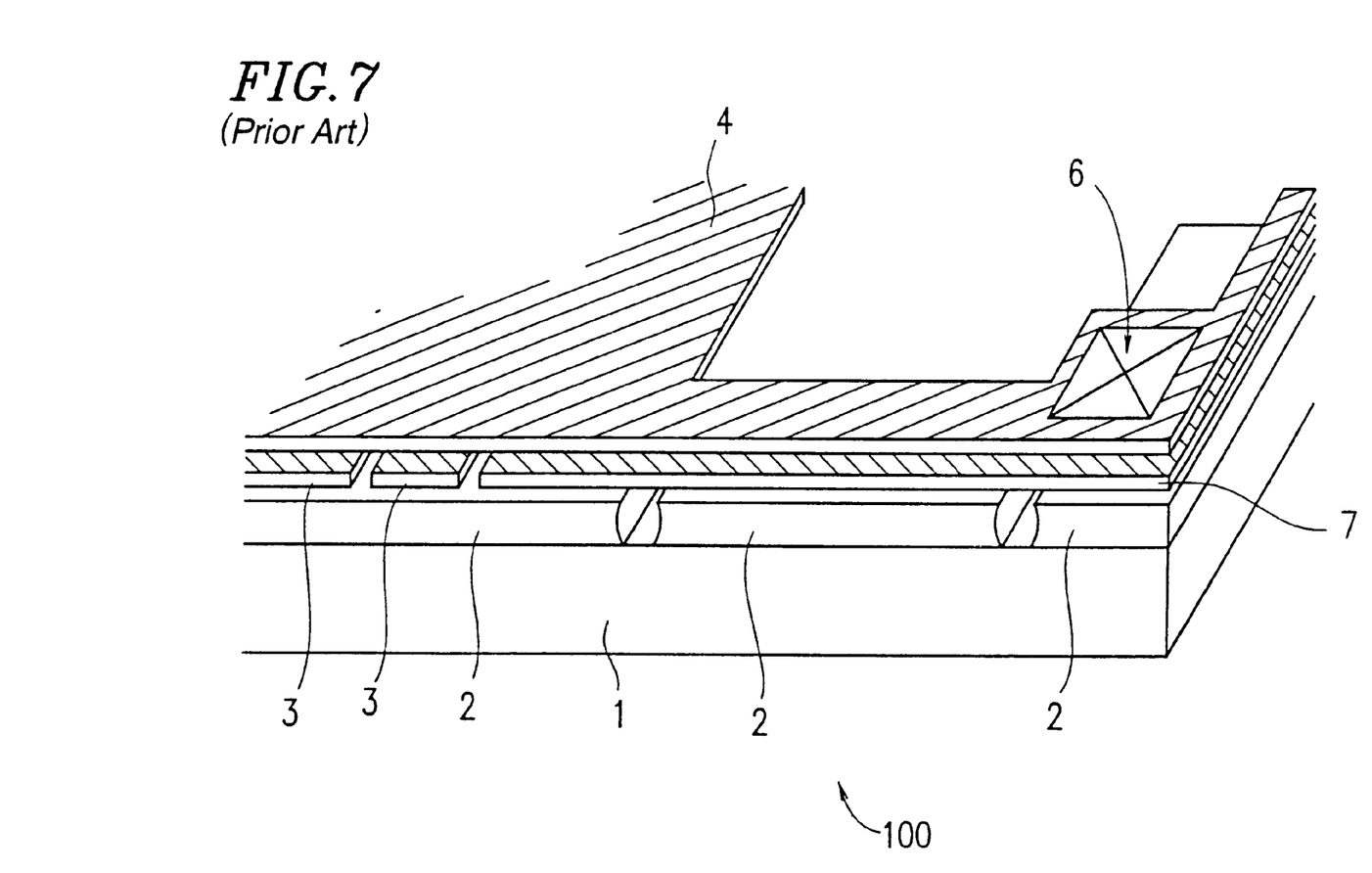
FIG. 7 shows a portion of a semiconductor device 100 having a conventional multilayer interconnection.
Figure 8A:
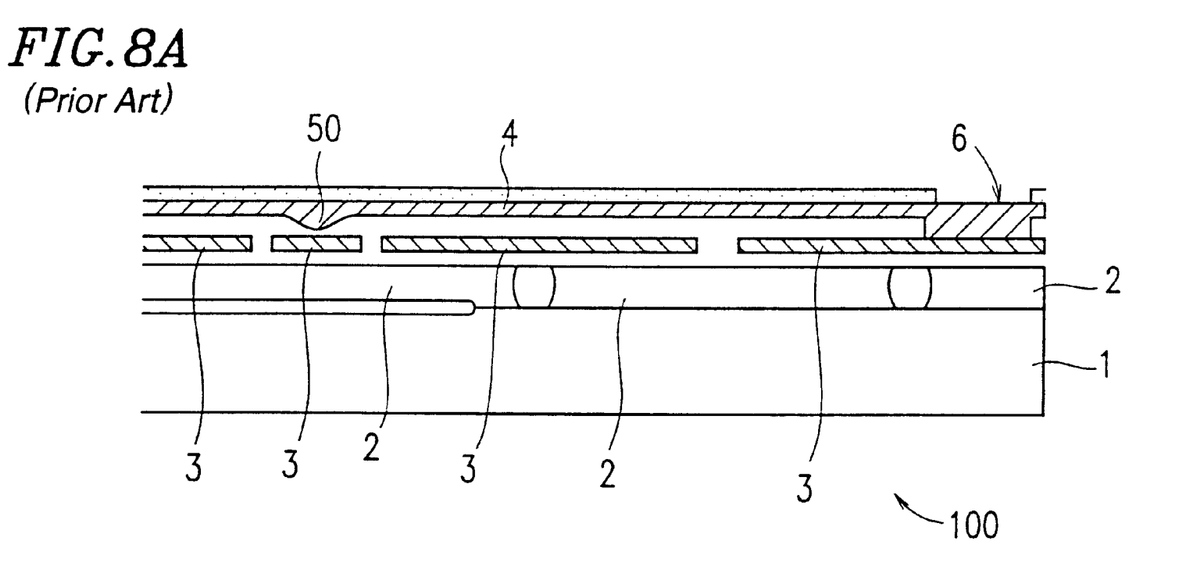
FIG. 8A is a cross-sectional view of a semiconductor device having a conventional multilayer interconnection.

FIGS. 7 and 8A show a semiconductor 100 having conventional multilayer interconnections.

The semiconductor device 100 includes a substrate 1, an epitaxial layer 2, an interconnection 3 of a first layer, an interconnection 4 of a second layer and a pad 6. The pad 6 is provided on the interconnection 4 of the second layer. The interconnection 4 of the second layer is used for shading light because it is necessary to prevent a photodetector incorporated into a circuit from being irradiated with light in order to avoid a circuital malfunction caused by irradiating the circuit. In other words, the interconnection 4 of the second layer is used as a shading layer or a light shield.

Figure 8B:
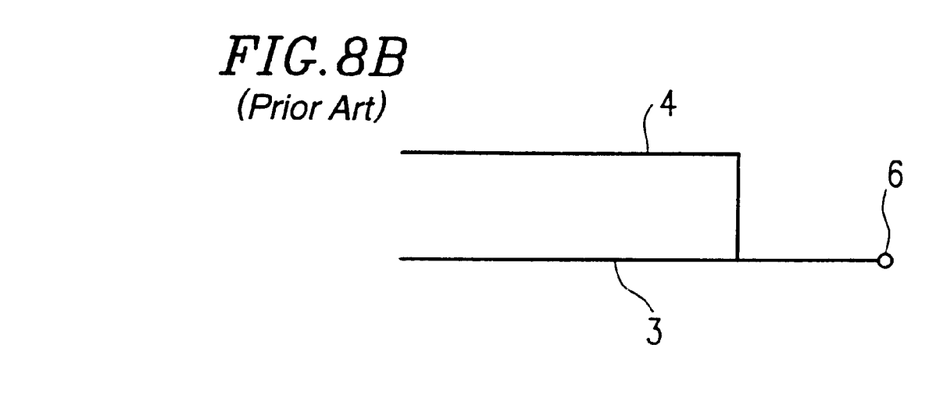
FIG. 8B shows a relationship between a first interconnection and a second interconnection.

In the semiconductor device 100, the interconnection 4 of the second layer is connected to a portion having a low-impedance potential, such as a ground (hereinafter, referred to as GND), a positive power source, a negative power source or the like. As shown in FIG. 8B, the interconnection 4 of the second layer is connected to GND, the positive power source or the negative power source.

If a portion of interlayer insulation failure 50 occurred by disorder of production process, generation of a pin hole or the like during a production process of the semiconductor device 100, a defective interlayer insulation occurs between the interconnection 3 of a first layer and the interconnection 4 of a second layer. Furthermore, when the interconnection 4 of the second layer is used as a shading layer or a light shield, the interconnection 4 of the second layer is formed such that an area thereof is greater, thereby increasing the probability that an incomplete interlayer insulation will result.

Figure 9:
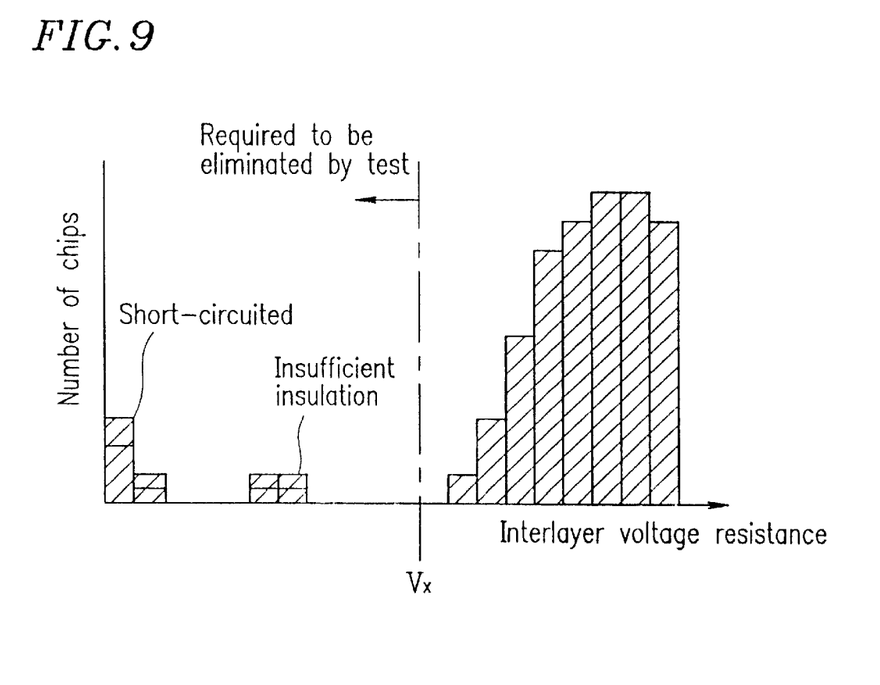
FIG. 9 is a graph showing a distribution of an initial voltage resistance for an interlayer insulation.

As shown in FIG. 9, examples of a defective interlayer insulation include a short-circuit between the interconnection 3 of a first layer and the interconnection 4 of a second layer and an insufficient interlayer insulation in which an initial voltage resistance of the interlayer insulation is less than Vx. Even in a case where the interconnection 3 of a first layer and the interconnection 4 of a second layer are not short-circuited, a low voltage resistance of the interlayer insulation will result in a high probability that the semiconductor device will become defective after a certain time period.

When the interconnection 3 of a first layer and the interconnection 4 of a second layer are short-circuited, it is easy to detect the short-circuited semiconductor device. However, it has been difficult to detect a semiconductor device in which the interlayer insulation is insufficient.

In view of the above problem, an object of the present invention is to detect and eliminate a semiconductor device in which the interlayer insulation is insufficient.

SUMMARY OF THE INVENTION

The present invention provides a semiconductor device having multilayer interconnections including a first interconnection and a second interconnection, wherein: the second interconnection is formed to be connected to one of a ground, a positive power source and a negative power source; the second interconnection is formed either not to be electrically connected to the first interconnection or to be connected to the first interconnection in a high impedance state; and the first interconnection and the second interconnection are electrically connected to each other during or after a characteristic inspection during which the second interconnection is provided with a pad for inspecting characteristics of the semiconductor device.

In one embodiment, an element for electrically connecting the first interconnection and the second interconnection is made of Au.

In another embodiment, an element for electrically connecting the first interconnection and the second interconnection is a broken and short-circuited zener diode.

In still another embodiment, an element for electrically connecting the first interconnection and the second interconnection is a zener diode to which a pulse voltage over a breakdown voltage is applied.

The present invention provides a method for inspecting characteristics of a semiconductor device, wherein the semiconductor device of claim 3 is inspected by a characteristic inspection other than the characteristic inspection of claim 1.

The present invention provides a method for inspecting characteristics of a semiconductor device, wherein the semiconductor device of claim 4 is inspected by a characteristic inspection other than the characteristic inspection of claim 1.

The present invention provides a method for producing a semiconductor device having multilayer interconnections including a first interconnection and a second interconnection, including the steps of: forming the first interconnection to be connected to one of a ground, a positive power source and a negative power source; forming the second interconnection not to be electrically connected to the first interconnection or but to be connected to the first interconnection in a high impedance state; providing the second interconnection with a pad for inspecting characteristics of the semiconductor device; inspecting characteristics of the semiconductor device; and electrically connecting the first interconnection and the second interconnection to each other during or after the step of inspecting characteristics.

In one embodiment, in the step of electrically connecting the first interconnection and the second interconnection to each other, the first interconnection and the second interconnection is electrically connected with Au.

In another embodiment, a method for producing a semiconductor device further includes a step of connecting the first interconnection and the second interconnection through a zener diode, wherein in the step of electrically connecting the first interconnection and the second interconnection to each other, the first interconnection and the second interconnection are electrically connected by breaking the zener diode so as to be short circuited.

In still another embodiment, in the step of electrically connecting the first interconnection and the second interconnection to each other, a pulse voltage over a breakdown voltage of the zener diode is applied to the zener diode in order to break the zener diode so as to be short-circuited.

Hereinafter, the function of the present invention will be described.

A semiconductor device is provided with a first interconnection of one layer and a second interconnection of another layer. The first interconnection is connected to a portion having a low impedance potential, such as GND, a positive power source or a negative power source. The second interconnection has a relatively large area for shading light.

In other words, the second interconnection functions as a shading surface (a shield surface) covering a plurality of the first interconnections.

The second interconnection is not electrically connected to the first interconnection or is connected to the first interconnection in a high impedance state so that it is relatively easy to detect a semiconductor device in which the interlayer insulation is defective between the first interconnection and the second interconnection.

After it is determined whether a semiconductor device is excellent or defective, the excellent semiconductor device is electrically connected between the first interconnection and the second interconnection.

Thus, the invention described herein makes possible the advantages of (1) providing a method for electrically connecting a first interconnection of one layer to a second interconnection of another layer during or after a step of inspecting characteristics of a semiconductor device, and (2) detecting and eliminating a semiconductor device in which the interlayer insulation is insufficient from the manufactured products.

These and other advantages of the present invention will become apparent to those skilled in the art upon reading and understanding the following detailed description with reference to the accompanying figures.

DESCRIPTION OF THE PREFERRED EMBODIMENTS (Embodiment 1)

Hereinafter, Embodiment 1 of a method for producing a semiconductor device of the present invention will be described with reference to FIGS. 1A to 3.

Figure 1A:
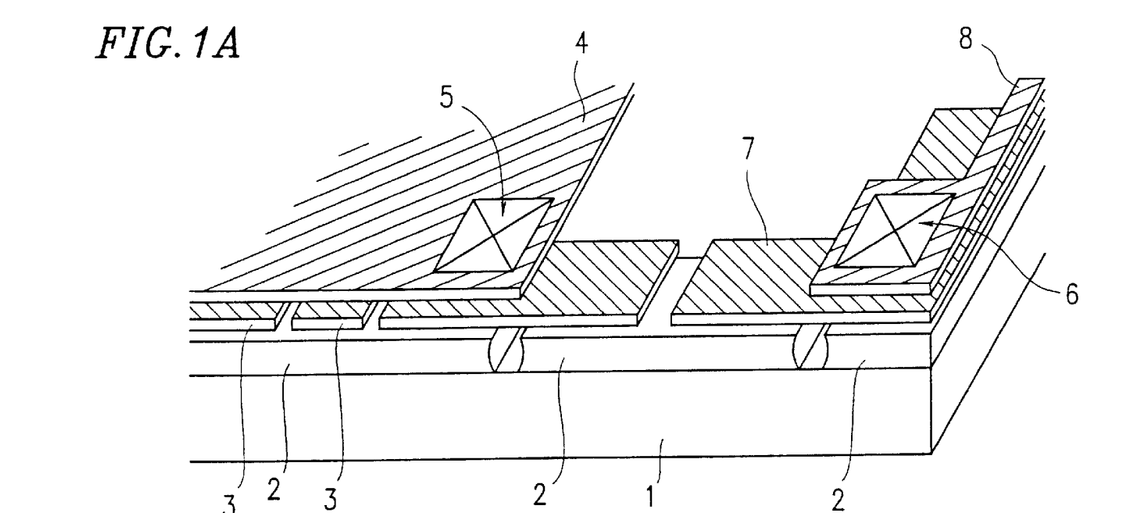
FIG. 1A is a perspective view showing a portion of a semiconductor device inspected in a step of inspecting its characteristics.

FIG. 1A shows a portion of a semiconductor device 10 before a voltage-withstand test, which will be later described, is performed.

The semiconductor device 10 includes a substrate 1, an epitaxial layer 2, interconnections 3 of a first layer, interconnections 4 and 8 of a second layer, a pad 5 for inspecting characteristics of the semiconductor device 10, and a pad 6 for connecting to GND. The pads 5 and 6 are provided on the interconnections 4 and 8 of the second layer, respectively. The interconnection 4 of the second layer is used for shading light. In other words, the interconnection 4 of the second layer is used as a shading layer or a light shield.

Figure 2:
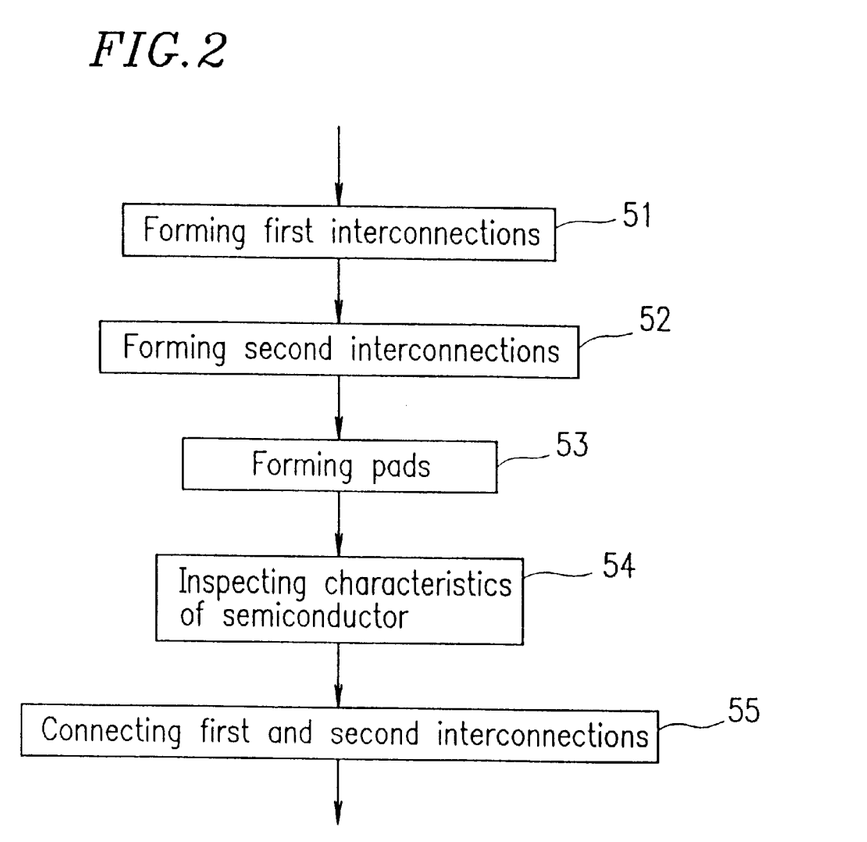
FIG. 2 is a flow chart of a method for producing a semiconductor device of the present invention.

Hereinafter, the steps of producing the semiconductor device 10 will be described with reference to FIG. 2. FIG. 2 shows a flow chart of Embodiment 1.

Before step 51, the substrate 1 is formed according to a conventional method. The epitaxial layer 2 is formed on the substrate 1 by the epitaxial method.

In step 51, the interconnections 3 and 7 of the first layer are formed partially or entirely on the epitaxial layer 2. In step 52, the interconnection 4 of the second layer is formed partially or entirely on the interconnection 3 of the first layer, and the interconnection 8 of the second layer is formed partially or entirely on the interconnection 7 of the first layer. When the semiconductor device is used, the interconnection 3 of the first layer is connected to a portion having a low impedance potential, such as GND, a positive power source or a negative power source. On the other hand, the interconnection 4 of the second layer is not connected to a portion having a low impedance potential, such as GND, the positive power source or the negative power source. In other words, the interconnection 4 of the second layer is electrically floating. Furthermore, a layer such as an insulation layer or the like is formed between the interconnection 3 of the first layer and the interconnection 4 of the second layer, but is not shown in FIG. 1A.

In step 53, the pads 5 and 6 are formed on the interconnections 4 and 8 of a second layer, respectively.

Figure 1B:
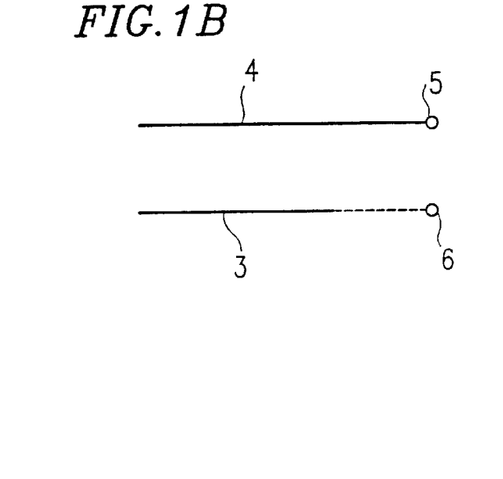
FIG. 1B shows a relationship between a first interconnection and a second interconnection.

In step 54, a voltage-withstand test between the interconnection 3 of the first layer and the interconnection 4 of the second layer is performed. As shown in FIG. 1B, the pad 5 formed in step 53 is connected to the interconnection 4 of the second layer, the pad 6 is connected to the interconnection 8 of the second layer and the interconnection 3 of the first layer. In FIG. 1A, it is not shown that the pad 6 is connected to the interconnection 3 of the first layer. Instead, the unshown connection is represented by a broken line in FIG. 1B. By applying a predetermined voltage to the pads 5 and 6, a defective semiconductor device results in a defective insulation (i.e., an electrical connection) between the interconnection 3 of the first layer and the interconnection 4 of the second layer, thereby enabling detection and elimination of the defective semiconductor device. Herein, examples of the predetermined voltage include a pulse voltage.

Figure 3:
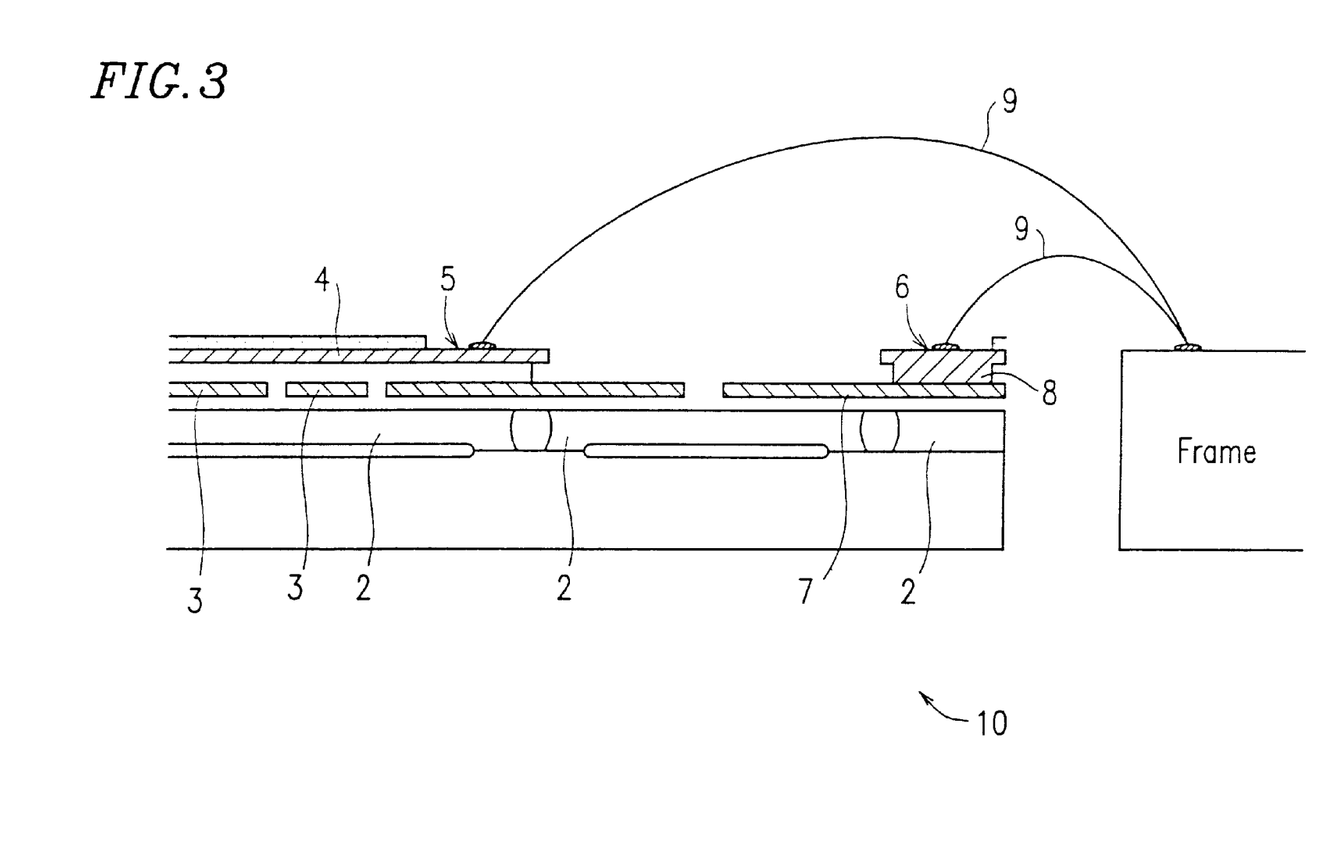
FIG. 3 shows a semiconductor device produced according to the present invention.

In step 55, the interconnection 4 of the second layer is connected through the pad 5 or the like to the pad 6 for connecting to GND. A thin metal wire 9 of Au, Al, Cu or the like is used for connecting the pad 5 and the pad 6. FIG. 3 shows semiconductor device 10 connected by the thin metal wire 9 in step 55.

(Embodiment 2)

Hereinafter, Embodiment 2 of a method for producing a semiconductor device of the present invention will be described with reference to FIGS. 4A to 6.

Figures 4A, 4B:
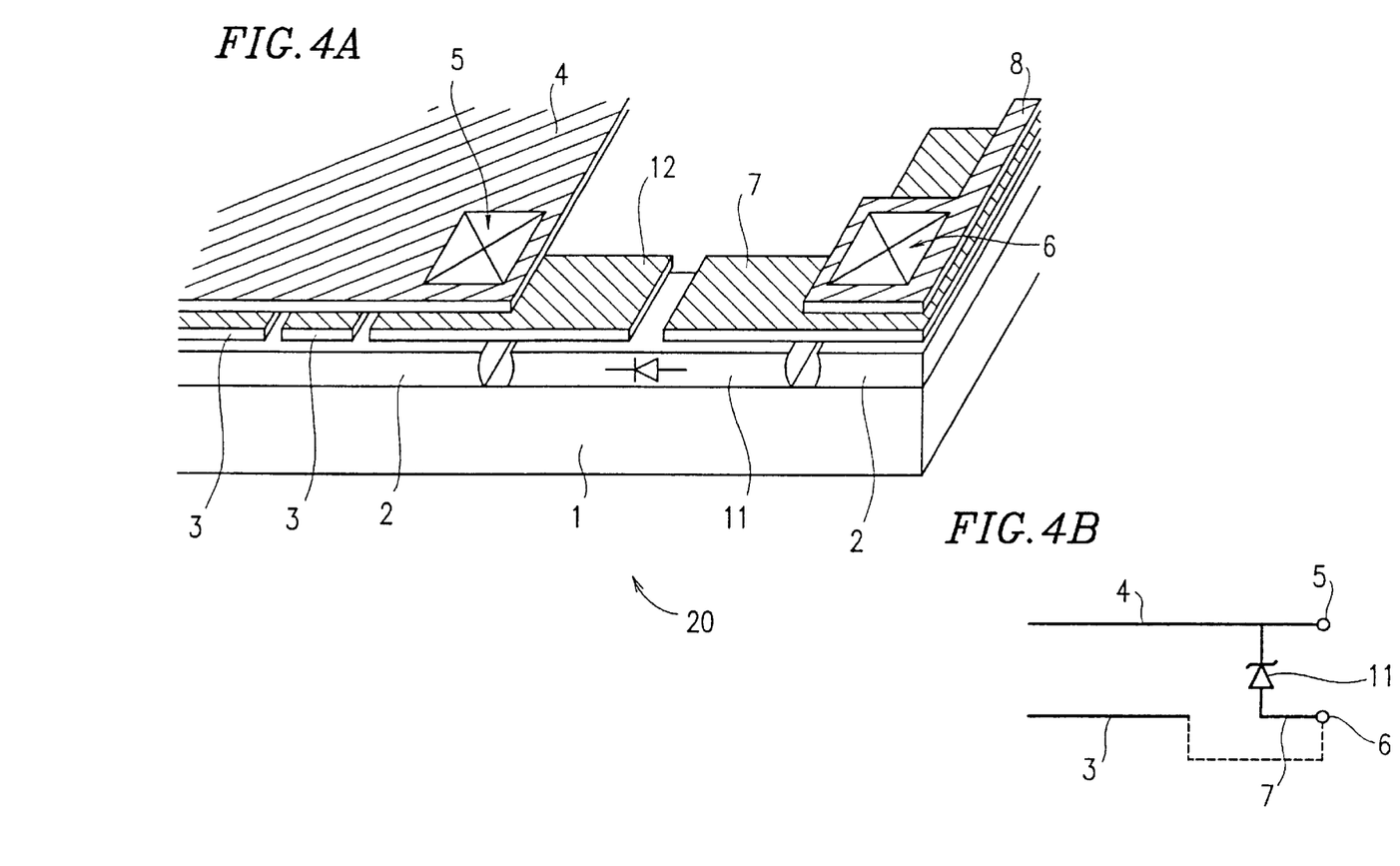
FIG. 4A is a perspective view showing a portion of a semiconductor device inspected in a step of inspecting its characteristics.
FIG. 4B shows a relationship between a first interconnection and a second interconnection.
Figure 6:
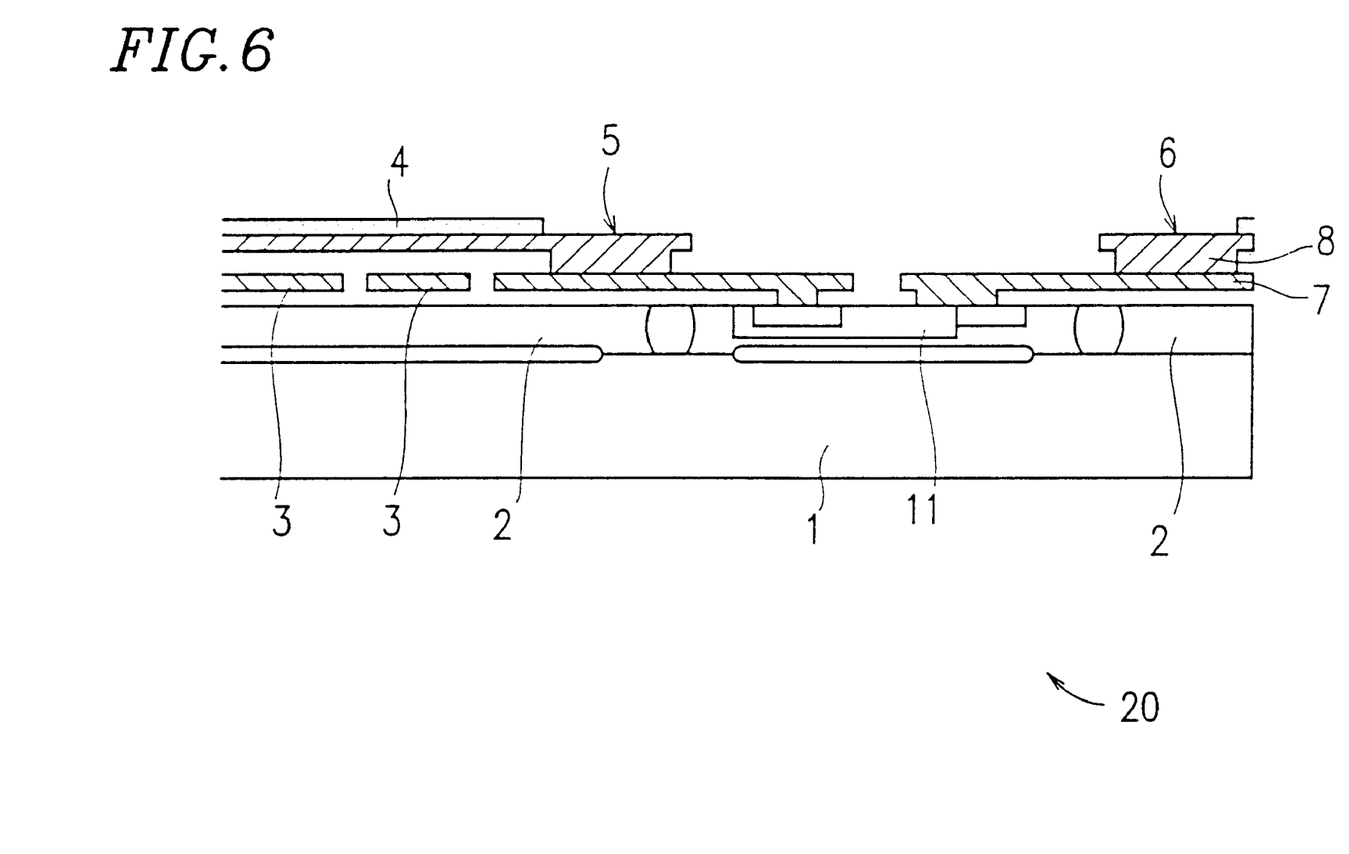
FIG. 6 is a cross-sectional view of the semiconductor device shown in FIG. 4A.

FIGS. 4A and 6 show a portion of a semiconductor device 20 before a voltage-withstand test, which will be later described, is performed. The semiconductor device 20 shown in FIG. 4A includes a substrate 1, an epitaxial layer 2, interconnections 3, 7 and 12 of a first layer, interconnections 4 and 8 of a second layer, a pad 5 for inspecting characteristics of the semiconductor device 20, a pad 6 for connecting to a ground, and a zener diode 11. As the zener diode 11, for example, a portion between a base and an emitter of one transistor is used. The pad 5 is connected to the pad 6 through the zener diode 11. In Embodiment 2, the same elements as those of Embodiment 1 are given the same reference numerals, and the description thereof is omitted.

Figure 5:
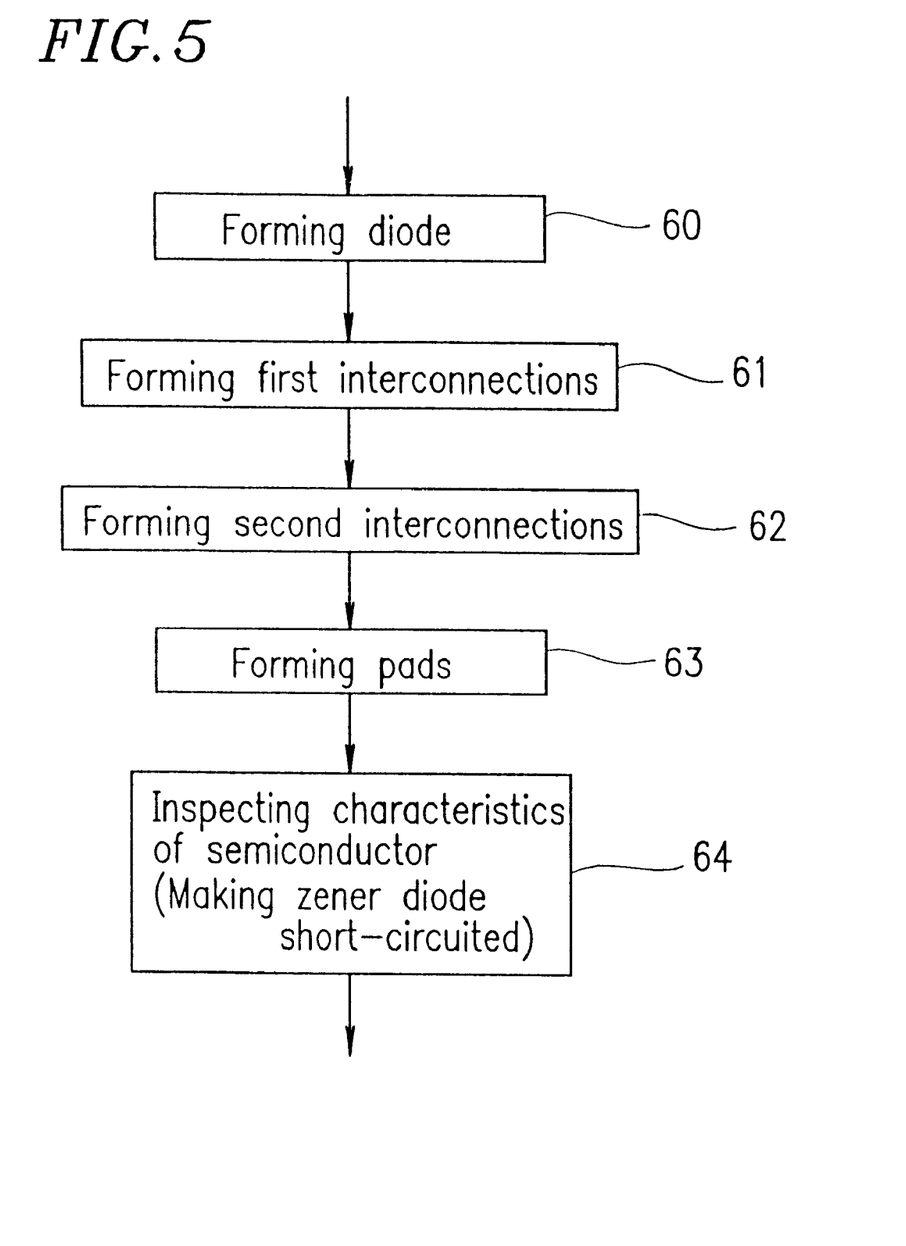
FIG. 5 is a flow chart of a method for producing a semiconductor device of the present invention.

Hereinafter, the steps of producing the semiconductor device 20 will be described with reference to FIG. 5.

Prior to step 60, the substrate 1 is formed according to a conventional method. The epitaxial layer 2 is formed on the substrate 1 by the epitaxial method. The zener diode 11 is formed in step 60. During steps 61 to 63, the interconnections 3, 7 and 12 of afirst layer, the interconnections 4 and 8 of a second layer, and pads 5 and 6 are formed. Steps 61 to 63 are substantially same as steps 51 to 53 of Embodiment 1.

In step 64, a voltage-withstand test is performed between the interconnection 3 of a first layer and the interconnection 4 of a second layer. As shown in FIGS. 4B and 6, the pad 5 is connected to the pad 6 through the zener diode 11. First, an insulation test is performed between the interconnection 3 of a first layer and the interconnection 4 of a second layer with a voltage lower than a zener diode breakdown (short-circuit) voltage. Next, a pulse voltage higher than a zener diode breakdown (short-circuit) voltage is applied between the pad 5 and the pad 6 of a semiconductor device which exhibited an excellent insulation in the above insulation test, thereby breaking the zener diode 11, by which it is short-circuited. During application of the voltage higher than a zener diode breakdown (short-circuit) voltage, a semiconductor device in which the interlayer insulation is insufficient is broken. Therefore, a semiconductor device in which the interlayer insulation is defective (i.e., abroken semiconductor device) can be distinguished from a semiconductor device in which the interlayer insulation is sufficient by a characteristic inspection which is performed later. Thus, a semiconductor in which the interlayer insulation is defective (i.e., a broken semiconductor device) can be detected, and then eliminated. Thereafter, an additional characteristic inspection other than the above described characteristic inspection may be performed. This additional characteristic inspection is an electrical, optical characteristic inspection for a semiconductor device, which is performed to the above described semiconductor device in which the interlayer insulation between the first interconnection and the second interconnection is sufficient.

In embodiment 2, the pulse voltage higher than a zener diode breakdown (short-circuit) voltage is, for example, 30 volts. The pulse voltage is applied to the pad 5 until the zener diode is broken, thereby breaking a semiconductor device having an interlayer insulation voltage resistance of 30 volts or less in which an interlayer insulation is defective.

In step 64, the zener diode 11 is broken by being short-circuited, thereby connecting the interconnection 3 of the first layer to the interconnection 4 of the second layer.

The present invention includes a method for electrically connecting a first interconnection of one layer to a second interconnection of another layer during or after a step of inspecting characteristics of a semiconductor device. In a method for inspecting characteristics of a semiconductor device of the present invention, a semiconductor device in which the interlayer insulation is insufficient can be detected, and the detected semiconductor device can be eliminated from the manufactured products.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor device comprising:
   multilayer interconnections including a first interconnection and a second interconnection, wherein:
   the first interconnection is formed to be connected to one of a ground, a positive power source and a negative power source,
   the second interconnection is formed either not to be electrically connected to the first interconnection or to be connected to the first interconnection in a high impedance state; and
   the first interconnection and the second interconnection are electrically connected to each other via a wire during or after a characteristic inspection during which the second interconnection is provided with a pad for inspecting characteristics of the semiconductor device.

2. A semiconductor device according to claim 1, wherein the wire for electrically connecting the first interconnection and the second interconnection is made from a material selected from the group of Au, Al and Cu.

3. A semiconductor device comprising:
   multilayer interconnections including a first interconnection and a second interconnection, wherein:
   the first interconnection is formed to be connected to one of a ground, a positive power source and a negative power source,
   the second interconnection is formed either not to be electrically connected to the first interconnection or to be connected to the first interconnection in a high impedance state;
   the first interconnection and the second interconnection are electrically connected to each other during or after a characteristic inspection during which the second interconnection is provided with a pad for inspecting characteristics of the semiconductor device; and
   wherein an element for electrically connecting the first interconnection and the second interconnection is a broken and short-circuited zener diode.

4. A semiconductor device comprising:
   multilayer interconnections including a first interconnection and a second interconnection, wherein:
   the first interconnection is formed to be connected to one of a around, a positive power source and a negative power source,
   the second interconnection is formed either not to be electrically connected to the first interconnection or to be connected to the first interconnection in a high impedance state;
   the first interconnection and the second interconnection are electrically connected to each other during or after a characteristic inspection during which the second interconnection is provided with a pad for inspecting characteristics of the semiconductor device; and
   wherein an element for electrically connecting the first interconnection and the second interconnection is a zener diode to which a pulse voltage over a breakdown voltage is applied.

5. A method for producing a semiconductor device having multilayer interconnections including a first interconnection and a second interconnection, the method comprising:

forming the first interconnection to be connected to one of a ground, a positive power source and a negative power source;

forming the second interconnection not to be electrically connected to the first interconnection or but to be connected to the first interconnection in a high impedance state;

providing the second interconnection with a pad for inspecting characteristics of the semiconductor device;

inspecting characteristics of the semiconductor device; and electrically connecting the first interconnection and the second interconnection to each other via a wire during or after the step of inspecting characteristics.

6. A method for producing a semiconductor device according to claim 5, wherein, in the step of electrically connecting the first interconnection and the second interconnection to each other via the wire, the first interconnection and the second interconnection are electrically connected with the wire made from a material selected from the group consisting of Au, Al and Cu.

7. A method for producing a semiconductor device having multilayer interconnections including a first interconnection and a second interconnection, the method comprising:

forming the first interconnection to be connected to one of a ground, a positive power source and a negative power source;

forming the second interconnection not to be electrically connected to the first interconnection or but to be connected to the first interconnection in a high impedance state;

providing the second interconnection with a pad for inspecting characteristics of the semiconductor device;

inspecting characteristics of the semiconductor device;

electrically connecting the first interconnection and the second interconnection to each other during or after the step of inspecting characteristics; and connecting the first interconnection and the second interconnection through a zener diode, wherein in the step of electrically connecting the first interconnection and the second interconnection to each other, the first interconnection and the second interconnection are electrically connected by breaking the zener diode so as to be short circuited.

8. A method for producing a semiconductor device having multilayer interconnections including a first interconnection and a second interconnection, the method comprising:

forming the first interconnection to be connected to one of a ground, a positive power source and a negative power source;

forming the second interconnection not to be electrically connected to the first interconnection or but to be connected to the first interconnection in a high impedance state;

providing the second interconnection with a pad for inspecting characteristics of the semiconductor device;

inspecting characteristics of the semiconductor device;

electrically connecting the first interconnection and the second interconnection to each other during or after the step of inspecting characteristics; and wherein, in the step of electrically connecting the first interconnection and the second interconnection to each other, a pulse voltage over a breakdown voltage of the zener diode is applied to the zener diode in order to break the zener diode so as to be short-circuited.

9. The device of claim 1, wherein the first interconnection and the second interconnection are electrically connected to each other in a low impedance state during or after the characteristic inspection.

10. A method for inspecting a semiconductor device comprising multilayer interconnections including a first interconnection and a second interconnection, wherein:

the first interconnection is formed to be connected to one of ground, a positive power source, and a negative power source;

the second interconnection is formed either not to be electrically connected to the first interconnection or to be connected to the first interconnection in a high impedance state, the method comprising:

performing a first characteristic inspection of the semiconductor device;

electrically connecting the first interconnection and the second interconnection to each other by short-circuiting a zener diode attached to the first interconnection and the second interconnection during or after the step of performing the first characteristic inspection;

performing a second characteristic inspection of the semiconductor device having the first and second interconnections connected through the short-circuited zener diode; and wherein the second characteristic inspection includes an electrical, optical characteristic inspection.

11. A method for inspecting a semiconductor device comprising multilayer interconnections including a first interconnection and a second interconnection, wherein:

the first interconnection is formed to be connected to one of ground, a positive power source, and a negative power source;

the second interconnection is formed either not to be electrically connected to the first interconnection or to be connected to the first interconnection in a high impedance state, the method comprising:

performing a first characteristic inspection of the semiconductor device;

electrically connecting the first interconnection and the second interconnection to each other by breaking a zener diode with a pulse voltage wherein the zener diode is attached to the first interconnection and the second interconnection during or after the step of performing the first characteristic inspection;

performing a second characteristic inspection of the semiconductor device having the first and second interconnections connected through the broken zener diode; and wherein the second characteristic inspection includes an electrical, optical characteristic inspection.

* * * * *